United States Patent
Chua et al.

(10) Patent No.: US 12,438,005 B2
(45) Date of Patent: Oct. 7, 2025

(54) LOW TEMPERATURE SELECTIVE ETCHING OF SILICON NITRIDE USING MICROWAVE PLASMA

(71) Applicant: Applied Materials, Inc., Santa Clara, CA (US)

(72) Inventors: Thai Cheng Chua, Cupertino, CA (US); Christian Valencia, Alhambra, CA (US); Doreen Yong, Singapore (SG); Tuck Foong Koh, Singapore (SG); Jenn-Yue Wang, Fremont, CA (US); Philip Allan Kraus, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 329 days.

(21) Appl. No.: 17/903,913

(22) Filed: Sep. 6, 2022

(65) Prior Publication Data
US 2023/0109912 A1   Apr. 13, 2023

Related U.S. Application Data

(60) Provisional application No. 63/253,487, filed on Oct. 7, 2021.

(51) Int. Cl.
*H01L 21/311* (2006.01)
(52) U.S. Cl.
CPC ............... *H01L 21/31116* (2013.01)
(58) Field of Classification Search
CPC ........... H01J 37/32266; H01J 37/32192; H01J 37/32403
See application file for complete search history.

(56) References Cited

U.S. PATENT DOCUMENTS

2014/0262040 A1\* 9/2014 Zhao ................. H01J 37/32256
315/32
2019/0237339 A1   8/2019 Bassett et al.
(Continued)

FOREIGN PATENT DOCUMENTS

JP      H11340197 A    12/1999
JP      2005327884 A   11/2005
(Continued)

OTHER PUBLICATIONS

International Preliminary Report on Patentability from PCT/US2022/044029 dated Apr. 18, 2024, 6 pgs.
(Continued)

*Primary Examiner* — Binh X Tran
(74) *Attorney, Agent, or Firm* — Schwabe, Williamson & Wyatt, P.C.

(57) ABSTRACT

Embodiments disclosed herein include a method of etching a 3D structure. In an embodiment, the method comprises providing the 3D structure in a microwave plasma chamber. In an embodiment, the 3D structure comprises a substrate, and alternating layers of silicon oxide and silicon nitride over the substrate. In an embodiment, the method further comprises flowing a first gas into the microwave plasma chamber, where the first gas comprises sulfur and fluorine. In an embodiment, the method comprises flowing a second gas into the microwave plasma chamber, where the second gas comprises an inert gas. In an embodiment, the method further comprises striking a plasma in the microwave plasma chamber, and etching the silicon nitride, where an etching selectivity of silicon nitride to silicon oxide is 50:1 or greater.

19 Claims, 7 Drawing Sheets

(56) References Cited

U.S. PATENT DOCUMENTS

| | | | |
|---|---|---|---|
| 2020/0126804 A1 | 4/2020 | Dole et al. | |
| 2021/0020445 A1* | 1/2021 | Wang | H01L 21/0217 |
| 2021/0098231 A1 | 4/2021 | Carducci et al. | |
| 2021/0111033 A1 | 4/2021 | Korolik et al. | |
| 2021/0287912 A1* | 9/2021 | Shiba | H01L 21/31122 |
| 2022/0051938 A1* | 2/2022 | Wu | H10D 30/6728 |
| 2023/0290643 A1* | 9/2023 | Matsui | H01J 37/32816 |

FOREIGN PATENT DOCUMENTS

| | | |
|---|---|---|
| TW | 202025284 A | 7/2020 |
| TW | 202040693 A | 11/2020 |
| TW | 202127500 A | 7/2021 |
| WO | 2020055837 A1 | 3/2020 |
| WO | 2020255631 A | 12/2020 |

OTHER PUBLICATIONS

Office Action for Taiwan Patent Application No. 111137464, dated Sep. 18, 2024, 22 pages.
International Search Report and Written Opinion from Patent Application No. PCT/US2022/044029 dated Jan. 6, 2023, 9 pgs.
Notice of Reasons for Rejection for Japanese Patent Application No. 2024-520019 dated Mar. 4, 2025, 7 pgs.
Office Action from Korean Patent Application No. 10-2024-7014319 dated May 13, 2025, 11 pgs.
Official Letter from Taiwan Patent Application No. 111137464 dated Jul. 30, 2025, 14 pgs.
Decision of Rejection from Japanese Patent Application No. 2024-520019 dated Aug. 12, 2025, 4 pgs.

* cited by examiner

LOW TEMPERATURE SELECTIVE ETCHING OF SILICON NITRIDE USING MICROWAVE PLASMA

CROSS-REFERENCE TO RELATED APPLICATIONS

This application claims the benefit of U.S. Provisional Application No. 63/253,487, filed on Oct. 7, 2021, the entire contents of which are hereby incorporated by reference herein.

BACKGROUND

1) Field

Embodiments relate to the field of semiconductor manufacturing and, in particular, to etching silicon nitride selective to silicon oxide using a microwave plasma source.

2) Description of Related Art

The fabrication of three-dimensional (3D) NAND devices includes the formation of alternating silicon oxide (e.g., $SiO_2$) layers and silicon nitride (e.g., $Si_3N_4$) layers. After the formation of the stack of alternating layers, the silicon nitride layers are selectively removed to form recesses that are ultimately filled with a conductor (e.g., tungsten). Currently, a wet etching process is used to selectively remove the silicon nitride layers. However, in the drying process after the etching, the suspended silicon oxide layers may collapse due to surface tension of the liquid. This leads to yield losses. Another issue with wet etching processes is that with future scaling of the 3D NAND devices, the number of layers of silicon oxide and silicon nitride increases. This is problematic because the liquid etchant will have difficulty filling into a deeper trench. This results in the etching of the top of the 3D structure being different than the etching of the bottom of the 3D structure.

SUMMARY

Embodiments disclosed herein include a method of etching a 3D structure. In an embodiment, the method comprises providing the 3D structure in a microwave plasma chamber. In an embodiment, the 3D structure comprises a substrate, and alternating layers of silicon oxide and silicon nitride over the substrate. In an embodiment, the method further comprises flowing a first gas into the microwave plasma chamber, where the first gas comprises sulfur and fluorine. In an embodiment, the method comprises flowing a second gas into the microwave plasma chamber, where the second gas comprises an inert gas. In an embodiment, the method further comprises striking a plasma in the microwave plasma chamber, and etching the silicon nitride, where an etching selectivity of silicon nitride to silicon oxide is 50:1 or greater.

In an additional embodiment, a method for etching silicon nitride selective to silicon oxide comprises providing a substrate comprising silicon nitride and silicon oxide in a microwave plasma chamber. In an embodiment, the microwave plasma chamber comprises, a chamber, a chamber lid, where the chamber lid is a dielectric material, a plurality of microwave applicators across a surface of the lid, a plurality of power sources, where each power source is coupled to one of the plurality of microwave applicators, and a gas injection path through the lid. In an embodiment, the method further comprises flowing a first gas into the chamber, where the first gas comprises sulfur and fluorine, and flowing a second gas into the chamber, where the second gas is an inert gas. In an embodiment, the method further comprises striking a plasma in the chamber, and etching the silicon nitride, where an etching selectivity of silicon nitride to silicon oxide (silicon nitride:silicon oxide) is 50:1 or greater.

Embodiments described herein may also comprise a method of etching a 3D structure, comprising providing the 3D structure in a microwave plasma chamber. In an embodiment, the 3D structure comprises, a substrate, and alternating layers of silicon oxide and silicon nitride over the substrate. In an embodiment, where the microwave plasma chamber comprises a chamber, a chamber lid, where the chamber lid is a dielectric material, a plurality of microwave applicators across a surface of the lid, a plurality of power sources, where each power source is coupled to one of the plurality of microwave applicators, and a gas injection path through the lid. In an embodiment, the method further comprises flowing a first gas into the chamber, where the first gas comprises sulfur and fluorine, flowing a second gas into the chamber, where the second gas is an inert gas, striking a plasma in the chamber, and etching the silicon nitride layers, where an etching selectivity of silicon nitride to silicon oxide (silicon nitride:silicon oxide) is 50:1 or greater.

DETAILED DESCRIPTION

Systems described herein include modular microwave plasma processing tools for etching silicon nitride selective to silicon oxide. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, wet etching of 3D NAND structures is limited in effectiveness, especially as devices continue to scale to include larger stacks of alternating silicon oxide layers and silicon nitride layers. In view of such limitations, dry etching processes have been explored in order to accommodate enhanced scaling of the 3D NAND structures. One etching chemistry that has been proposed is an $NF_3$ gas with an inert gas. $NF_3$ provided selective etching of the 3D NAND structure, but left behind a fluorine residue. Fluorine residue is not acceptable because the fluorine will result in corrosion of the subsequently deposited metal (e.g., tungsten).

Accordingly, embodiments disclosed herein include an etching chemistry that comprises sulfur and fluorine (e.g., $SF_6$). The $SF_6$ may be flown into the chamber with an inert gas, such as argon or helium. $SF_6$ and inert gas etching is a dry etching process. As such, there is no post etch drying step that could potentially damage the resulting features. Additionally, it is to be appreciated that the etching chemistry is aided in its effectiveness by the type of plasma chamber that is used to implement the etching. In a particular embodiment, the plasma chamber is a modular microwave plasma source. Such plasma sources have a high plasma density and very low plasma potential (e.g., less than 10 eV). This results in much less sputtering damage to the etched structure as compared to a typical inductively coupled plasma (ICP) source, which has a higher plasma potential (e.g., approximately 20 eV or more).

Furthermore, it is to be appreciated that $SF_6$ and argon source gases for a dry etching process may not even work in all types of chambers. For example, it has been shown that in a remote plasma process, the use of $SF_6$ and an inert gas does not result in any etching at all. In other types of plasma chambers (e.g., ICP) sources, the etching selectivity of SiN to $SiO_X$ is significantly lower than what is achievable in modular microwave plasma sources. As such, it is an unexpected result that the use of $SF_6$ and an inert gas work to provide a high etch selectivity dry etching process.

Figure 1A:
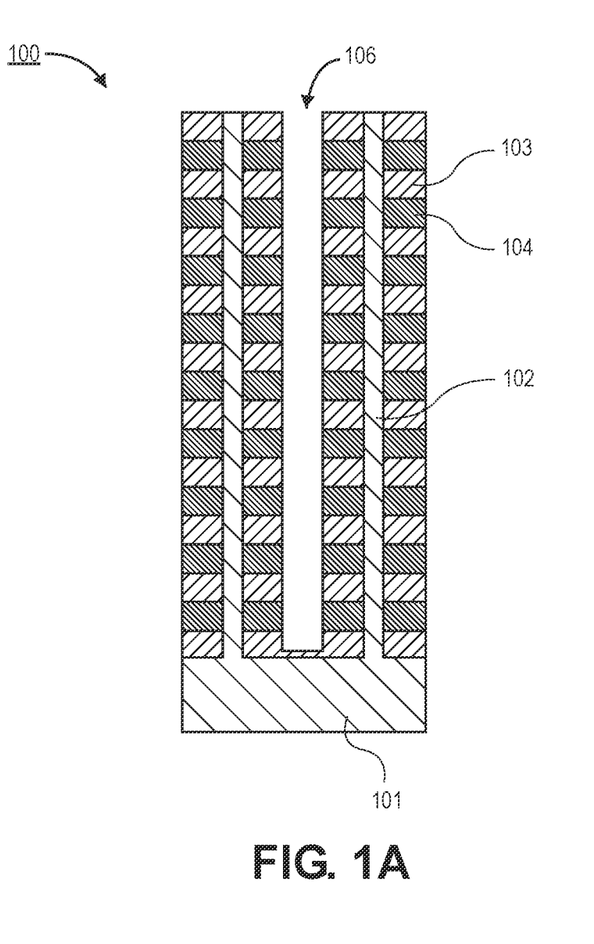
FIG. 1A is a cross-sectional illustration of a portion of a 3D NAND structure with alternating silicon oxide layers and silicon nitride layers, in accordance with an embodiment.
Figure 1B:
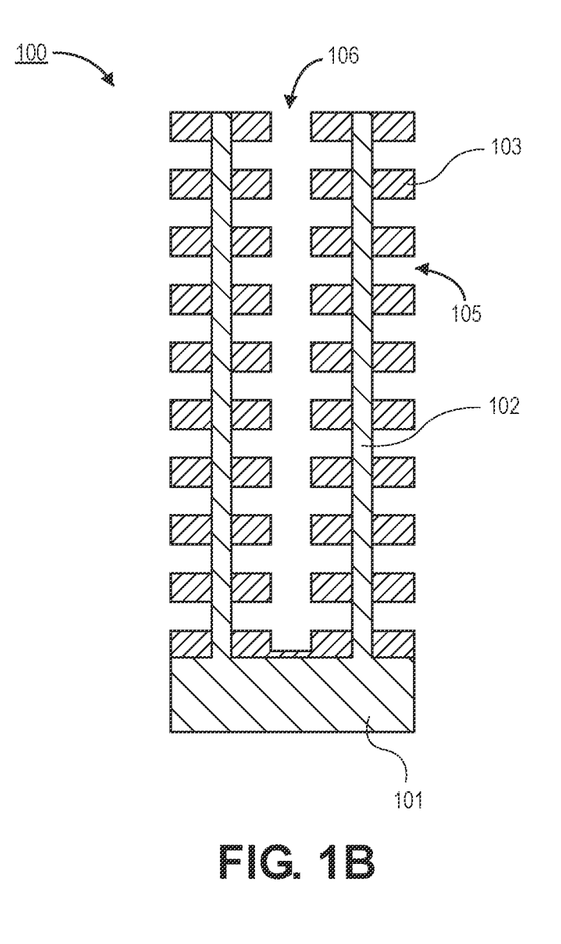
FIG. 1B is a cross-sectional illustration of a portion of the 3D NAND structure with the silicon nitride layers removed with an etching process, in accordance with an embodiment.

Referring now to FIGS. 1A and 1B, a pair of cross-sectional illustrations depicting a dry etching process is shown, in accordance with an embodiment. In an embodiment, the etching process is implemented on a 3D structure 100. For example, the 3D structure 100 may be a structure used for a 3D NAND device. The 3D structure 100 may include a substrate 101, such as a polysilicon substrate, or the like. Polysilicon pillars 102 may extend up from the substrate 101. In an embodiment, each pillar 102 is lined by alternating layers of silicon oxide (e.g., $SiO_X$) 103 and silicon nitride (e.g., $Si_XN_Y$) 104. The sidewalls of the silicon nitride layers 104 and the silicon oxide layers 103 may be exposed by a trench 106 that passes through the layers between the pillars 102.

In a particular embodiment, the silicon nitride layers 104 are sacrificial layers. That is, the silicon nitride layers 104 are etched away, as shown in FIG. 1B. The removal of the silicon nitride layers 104 results in the formation of recesses 105 between the silicon oxide layers 103. In some instances, the recesses 105 are subsequently filled with a conductive layer (not shown) such as tungsten or the like. Because a conductive (and oxidizable) material is provided in the recesses 105, the surfaces of the silicon oxide layers 103 should be free from materials that induce corrosion, such as fluorine.

In an embodiment, the etching process needs to have a high selectivity of the silicon nitride layers 104 over the silicon oxide layers 103. Additional beneficial characteristics are that the absolute etch rate of the silicon nitride is high, in order to reduce the time needed for the etch. Furthermore, the etching chemistry should not leave behind residual fluorine. It has been shown, as will be described in greater detail below, that such parameters are met using a modular microwave source with an $SF_6$ and inert gas etching chemistry.

In FIGS. 1A and 1B, the structure 100 is shown as being suitable for a 3D NAND device. The use of the etching process described herein is particularly beneficial for use in 3D NAND devices. This is because the etching uniformity in highly scaled 3D NAND devices is excellent. That is, for structures with high aspect ratios and many silicon nitride layers 104 and silicon oxide layers 103, the etching at the top of the structure and the bottom of the structure is substantially uniform. Additionally, complete removal of the silicon nitride layers 104 without significantly damaging the silicon oxide layers 103 is possible.

However, it is to be appreciated that embodiments are not limited to the etching of 3D NAND structures. For example, similar etching processes may be used wherever a silicon nitride structure needs to be etched selectively to a silicon oxide layer. For example, a silicon nitride layer may be provided over a silicon oxide layer, with the etching process etching through the silicon nitride layer and stopping on the oxide layer. In such an embodiment, the silicon oxide layer may be considered an etch stop layer. While two examples of architectures that benefit from the $SF_6$ etching process are provided, it is to be appreciated that the provided examples are non-limiting, and there may be many different applications and architectures that benefit from the $SF_6$ etching process in accordance with embodiments described herein.

Figure 2:
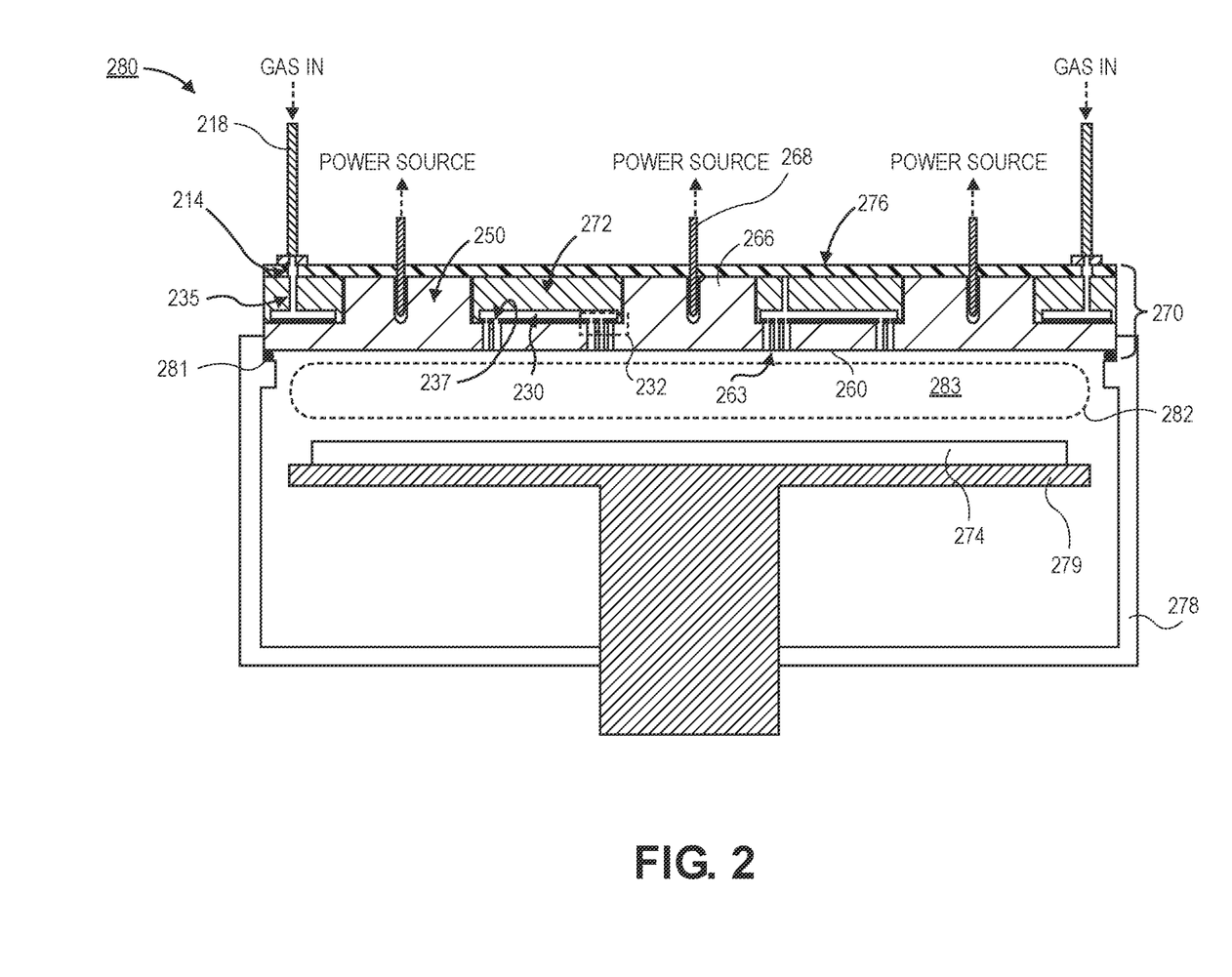
FIG. 2 is a cross-sectional illustration of a microwave plasma chamber for dry etching a 3D NAND structure, in accordance with an embodiment.

Referring now to FIG. 2, a cross-sectional illustration of a processing tool 280 that includes an assembly 270 is shown, in accordance with an embodiment. In an embodiment, the processing tool comprises a chamber 278 that is sealed by the assembly 270. For example, the assembly 270 may rest against one or more O-rings 281 to provide a vacuum seal to an interior volume 283 of the chamber 278. In other embodiments, the assembly 270 may interface with the chamber 278. That is, the assembly 270 may be part of a lid that seals the chamber 278. In an embodiment, a chuck 279 or the like may support a workpiece 274 (e.g., wafer, substrate, etc.).

In an embodiment, the assembly 270 may comprise a monolithic source array 250, a housing 272, and a lid plate 276. The monolithic source array 250 may comprise a dielectric plate 260 and a plurality of protrusions 266 extending up from the dielectric plate 260. While a monolithic source array 250 is shown, it is to be appreciated that the protrusions 266 may be distinct from the dielectric plate 260. That is, protrusions 266 may be isolated bodies that sit on top of the dielectric plate 260. In an embodiment, there may be five or more protrusions 266, or ten or more protrusions 266. In a particular embodiment, there may be 19 protrusions 266. The protrusions 266 comprise a dielectric material. The protrusions 266 function as dielectric resonators in order to couple microwaves into the chamber volume 283. In some embodiments, the protrusions 266 may be referred to as microwave applicators, or applicators for short.

In an embodiment, the housing 272 may have openings sized to receive the protrusions 266. The housing 272 may be a conductive material. In some embodiments, the housing 272 is grounded. In the illustrated embodiment, the housing 272 is directly supported by the dielectric plate 260, but it is to be appreciated that a thermal interface material or the like may separate the housing 272 from the dielectric plate 260. In an embodiment, monopole antennas 268 may extend into holes in the protrusions 266. In an embodiment, the holes in the protrusions 266 are larger than the monopole antennas 268 in order to allow for thermal expansion in order to prevent damage to the monolithic source array 250. The monopole antennas 268 may pass through a lid plate 276 over the housing 272 and the protrusions 266. In an embodiment, the monopole antennas 268 may each be coupled to different power sources. The construction of the power sources will be described in greater detail below.

In an embodiment, the chamber volume 283 may be suitable for striking a plasma 282. That is, the chamber volume 283 may be a vacuum chamber. That is, a vacuum source may be fluidically coupled to the chamber volume 283. In order to strike the plasma 282, processing gasses may be flown into the chamber volume 283. The processing gasses may enter the assembly 270 via a gas line 218. The processing gas then passes through a hole 214 through the lid plate 276 and enters a hole 235 in the housing 272. The hole 235 intersects a gas distribution channel 230 that laterally distributes the processing gas. While shown as a plurality of discrete gas distribution channels 230, it is to be appreciated that the gas distribution channels 230 are fluidically coupled to each other out of the plane of FIG. 2.

In an embodiment, the processing gas exits the channel 230 through groups 232 of holes 237 in a cover over the channel 230. The processing gas then passes through gas distribution holes 263 through the dielectric plate 260 of the monolithic source array 250 and enters the chamber volume 283.

Figure 3:
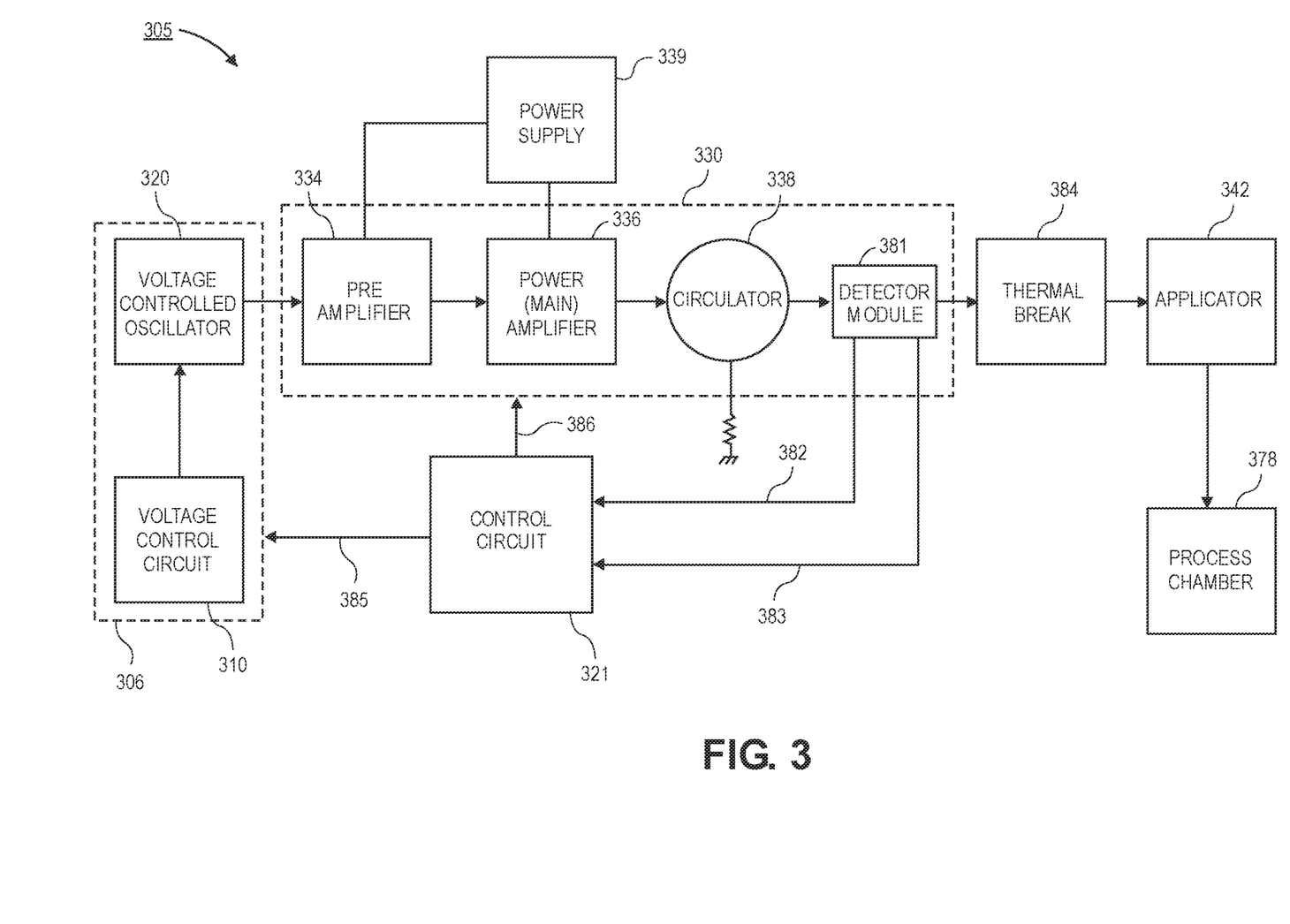
FIG. 3 is a schematic diagram of a power source for the microwave applicators in FIG. 2, in accordance with an embodiment.

Referring now to FIG. 3, a schematic of a solid state high-frequency emission module 305 is shown, in accordance with an embodiment. The high-frequency emission module 305 may be considered the power source that is coupled to the monopole antennas in FIG. 2. In an embodiment, the high-frequency emission module 305 comprises an oscillator module 306. The oscillator module 306 may include a voltage control circuit 310 for providing an input voltage to a voltage controlled oscillator 320 in order to produce high-frequency electromagnetic radiation at a desired frequency. Embodiments may include an input voltage between approximately 1V and 10V DC. The voltage controlled oscillator 320 is an electronic oscillator whose oscillation frequency is controlled by the input voltage. According to an embodiment, the input voltage from the voltage control circuit 310 results in the voltage controlled oscillator 320 oscillating at a desired frequency. In an embodiment, the high-frequency electromagnetic radiation may have a frequency between approximately 0.1 MHz and 30 MHz. In an embodiment, the high-frequency electromagnetic radiation may have a frequency between approximately 30 MHz and 300 MHz. In an embodiment, the high-frequency electromagnetic radiation may have a frequency between approximately 300 MHz and 1 GHz. In an embodiment, the high-frequency electromagnetic radiation may have a frequency between approximately 1 GHz and 300 GHz.

According to an embodiment, the electromagnetic radiation is transmitted from the voltage controlled oscillator 320 to an amplification module 330. The amplification module 330 may include a driver/pre-amplifier 334, and a main power amplifier 336 that are each coupled to a power supply 339. According to an embodiment, the amplification module 330 may operate in a pulse mode. For example, the amplification module 330 may have a duty cycle between 1% and 99%. In a more particular embodiment, the amplification module 330 may have a duty cycle between approximately 15% and 50%.

In an embodiment, the electromagnetic radiation may be transmitted to the thermal break 384 and the applicator 342 after being processed by the amplification module 330. However, part of the power transmitted to the thermal break 384 may be reflected back due to the mismatch in the output impedance. Accordingly, some embodiments include a detector module 381 that allows for the level of forward power 383 and reflected power 382 to be sensed and fed back to the control circuit module 321. It is to be appreciated that the detector module 381 may be located at one or more different locations in the system (e.g., between the circulator 338 and the thermal break 349). In an embodiment, the control circuit module 321 interprets the forward power 383 and the reflected power 382, and determines the level for the control signal 385 that is communicatively coupled to the oscillator module 306 and the level for the control signal 386 that is communicatively coupled to the amplification module 330. In an embodiment, control signal 385 adjusts the oscillator module 306 to optimize the high-frequency radiation coupled to the amplification module 330. In an embodiment, control signal 386 adjusts the amplification module 330 to optimize the output power coupled to the applicator 342 through the thermal break 384. In an embodiment, the feedback control of the oscillator module 306 and the amplification module 330, in addition to the tailoring of the impedance matching in the thermal break 384, may allow for the level of the reflected power to be less than approximately 5% of the forward power. In some embodiments, the feedback control of the oscillator module 306 and the amplification module 330 may allow for the level of the reflected power to be less than approximately 2% of the forward power.

Accordingly, embodiments allow for an increased percentage of the forward power to be coupled into the processing chamber 378, and increases the available power coupled to the plasma. Furthermore, impedance tuning using a feedback control is superior to impedance tuning in typical slot-plate antennas. In slot-plate antennas, the impedance tuning involves moving two dielectric slugs formed in the applicator. This involves mechanical motion of two separate components in the applicator, which increases the complexity of the applicator. Furthermore, the mechanical motion may not be as precise as the change in frequency that may be provided by a voltage controlled oscillator 320.

Figure 4:
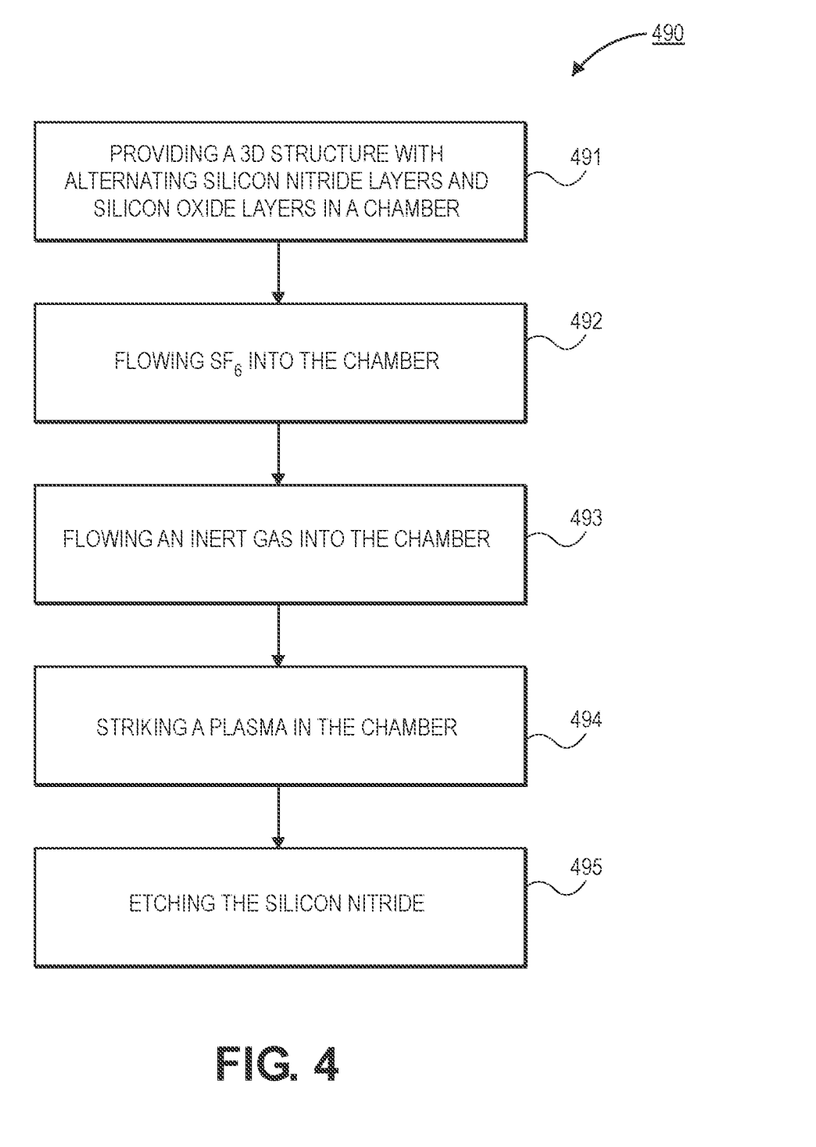
FIG. 4 is a flow diagram of a process for etching silicon nitride layers in a 3D NAND structure with a microwave plasma chamber, in accordance with an embodiment.

Referring now to FIG. 4, a flow diagram of a process 490 for etching silicon nitride selective to silicon oxide is shown, in accordance with an embodiment. In an embodiment, process 490 begins with operation 491 which comprises providing a 3D structure with alternating silicon nitride layers and silicon oxide layers in a chamber. In an embodiment, the 3D structure may be a 3D NAND structure, or, more particularly, an intermediate structure used in the fabrication of a 3D NAND structure. In an embodiment, the 3D structure may be substantially similar to the structure described above with respect to FIG. 1A. For example, an underlying semiconductor substrate may be covered by a plurality of alternating layers of silicon nitride and silicon oxide. A deep trench may be provided through the thickness of the layers. As such, sidewall surfaces of the silicon nitride and silicon oxide layers are exposed. While a particular 3D structure is described as one example, it is to be appreciated that any architecture with a silicon nitride layer and an oxide layer may be provided in the chamber in accordance with various embodiments.

In an embodiment, the 3D structure may be provided on a substrate, such as a semiconductor substrate. In an particular embodiment, a wafer comprising a plurality of 3D structures is provided in the chamber. In an embodiment, the chamber may include a modular microwave plasma source. For example, a process tool similar to the modular microwave plasma source described in greater detail above may be used, in accordance with an embodiment.

In an embodiment, process 490 may continue with operation 492, which comprises flowing a processing gas into the chamber. In an embodiment, the processing gas comprises sulfur and fluorine. In a particular embodiment, the processing gas comprises $SF_6$. In an embodiment, process 490 may continue with operation 493 which comprises flowing an inert gas into the chamber. In an embodiment, the inert gas comprises argon or helium. In some embodiments, argon is used since it ionizes easily and increases plasma density. However, embodiments that utilize helium may exhibit reduced oxide damage and improved etch selectivity, compared to when argon gas is used. While described as discrete processing operations, it is to be appreciated that the fluorine containing gas and the inert gas may be flown into the chamber at substantially the same time. In an embodiment, the ratio of the processing gas to the inert gas (e.g., $SF_6/Ar$) may be approximately 0.4 or smaller, approximately 0.1 or smaller, or approximately 0.05 or smaller. In some embodiments, a third gas may also be flown into the chamber. For example, $H_2S$ or dichloro-silane (DCS) may be be flown into the chamber along with the $SF_6$ and the inert gas. In an embodiment, the amount of $H_2S$ or DCS may be less than the amount of $SF_6$.

In an embodiment, process 490 may continue with operation 494, which comprises striking a plasma in the chamber 494. In an embodiment, a pressure in the chamber during the striking of the plasma may be approximately 0.5 Torr or lower, or approximately 0.2 Torr or lower. In an embodiment, a distance between the plasma source and the substrate with the 3D structure may be approximately one inch or smaller, or a quarter inch or smaller. In an embodiment, the plasma may be generated from a plurality of microwave applicators, similar to the structure shown in FIG. 2.

In an embodiment, process 490 may continue with operation 495, which comprises etching the silicon nitride. In an embodiment the silicon nitride may be etched with selectivity over the silicon oxide of approximately 50:1 or greater, approximately 400:1 or greater, or approximately 1,600:1 or greater. Additionally, it is to be appreciated that the etching process leaves behind substantially no fluorine residue. As such, subsequent corrosion problems are avoided. Furthermore, it is to be appreciated that the etching uniformity on high aspect ratio structures is high. For example, the etch rate of silicon nitride at a top of a 3D NAND structure may be substantially similar to an etch rate of silicon nitride at a bottom of the 3D NAND structure. In some embodiments, a ratio of the etch rate of silicon nitride between the top of the structure and the bottom of the structure may be between approximately 1.3:1 and approximately 1:1. In some embodiments, the etch rate of silicon nitride may be approximately 15 nm/min. or greater, or approximately 25 nm/min. or greater.

Figure 5:
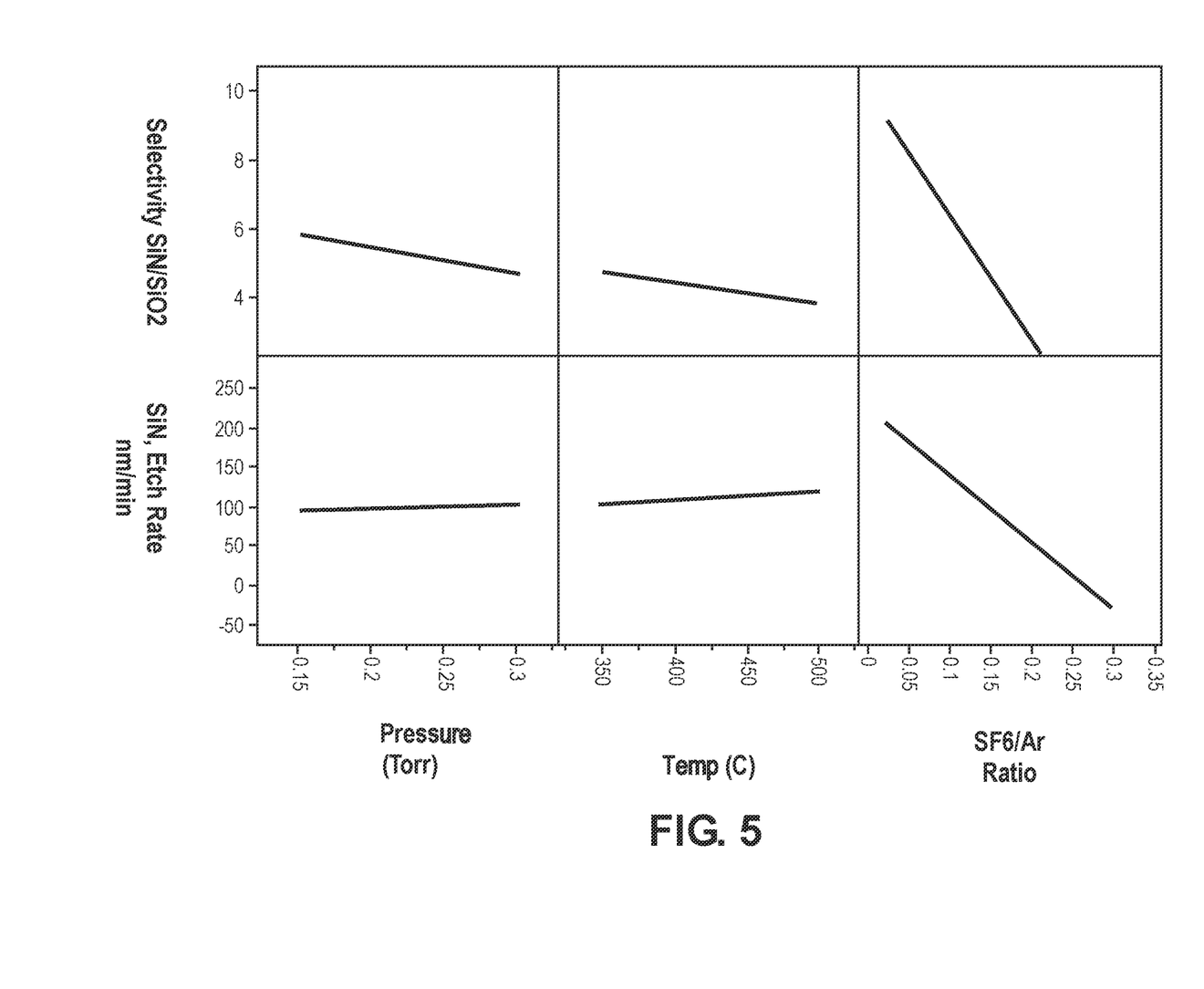
FIG. 5 is a series of graphs depicting the selectivity and etch rate for various processing conditions, in accordance with an embodiment.

Referring now to FIG. 5, a series of graphs that depict the effects of various pressures, temperatures, and process gas ratios is shown. In accordance with an embodiment. The top three graphs depict the selectivity between the silicon nitride and the silicon oxide, and the bottom three graphs depict the etch rate of the silicon nitride. As shown, pressure has a minimal effect on the etch rate of silicon nitride. Lower pressures are shown to have some beneficial effect on the selectivity. Lower temperatures have slightly lower etch rates, but see improved selectivity. The largest effects are seen in the variation of process gas ratios. Generally, lower ratios of the processing gas (e.g., $SF_6$) to the inert gas (e.g., Ar) result in improved etch rate and etch selectivities.

It is to be appreciated that the etching temperatures (i.e., substrate temperatures) for embodiments disclosed herein may be considered low temperature processes. For example, substrate temperatures may be approximately 500° C. or lower. In a particular embodiment, the substrate temperature may be at approximately 100° C.

Figure 6:
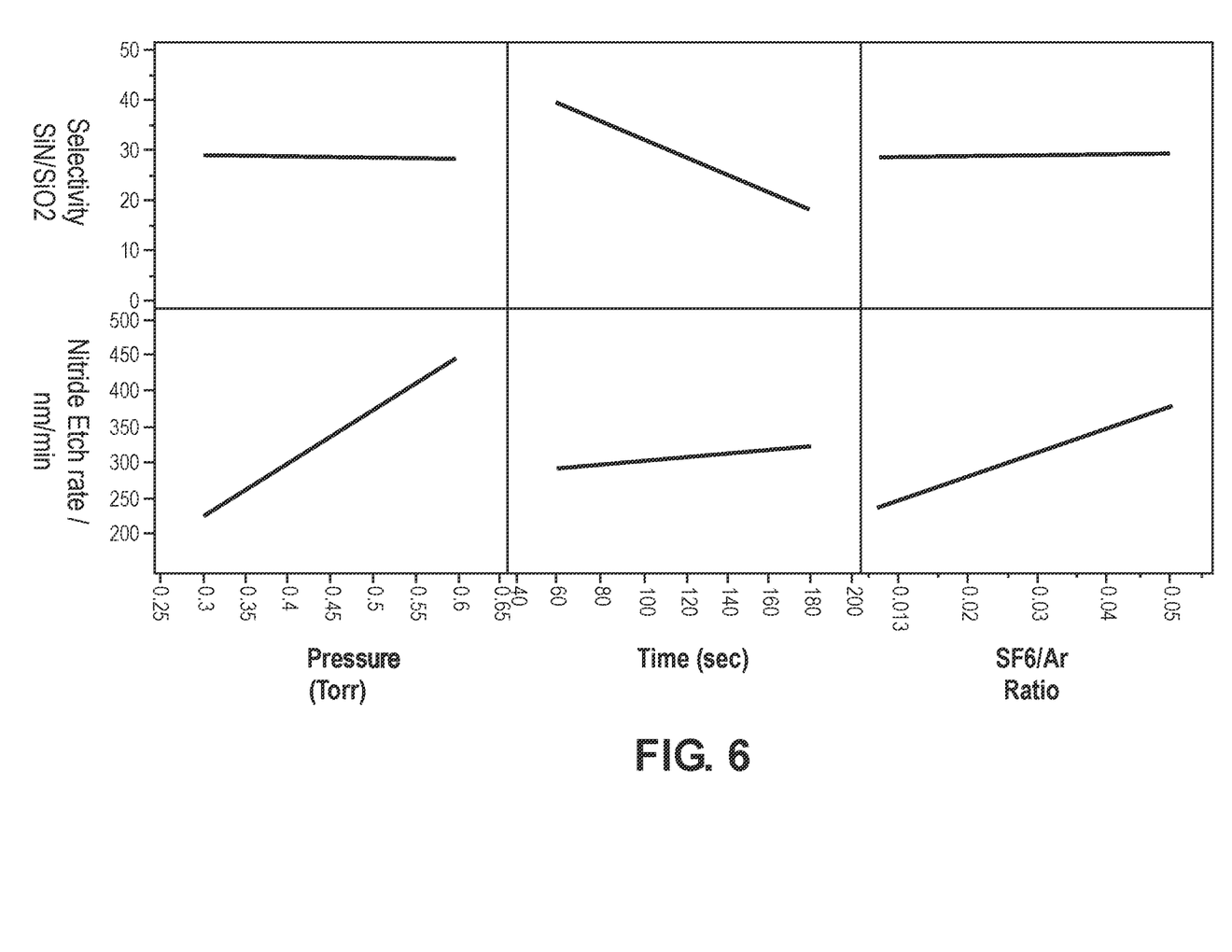
FIG. 6 is a series of graphs depicting the selectivity and etch rate for various processing conditions while holding a constant temperature, in accordance with an embodiment.

A series of graphs depicting the effect pressure, time, and processing gas ratio have on etch selectivity and etch rate for a fixed temperature of 100° C. is shown in FIG. 6. Similar to FIG. 5, the top three graphs depict the effect on etch selectivity, and the bottom three graphs depict the effect on silicon nitride etch rate.

As shown, the etch selectivity at 100° C. is significantly better than the selectivity at higher temperatures shown in FIG. 5. Selectivity is also minimally affected by pressure. However, the etch rate decreases with decreasing pressure. At lower times, the selectivity is improved, and there is minimal effect on etch rate. The processing gas ratio has minimal effect on the selectivity, and higher ratios improve the etch rate.

Figure 7:
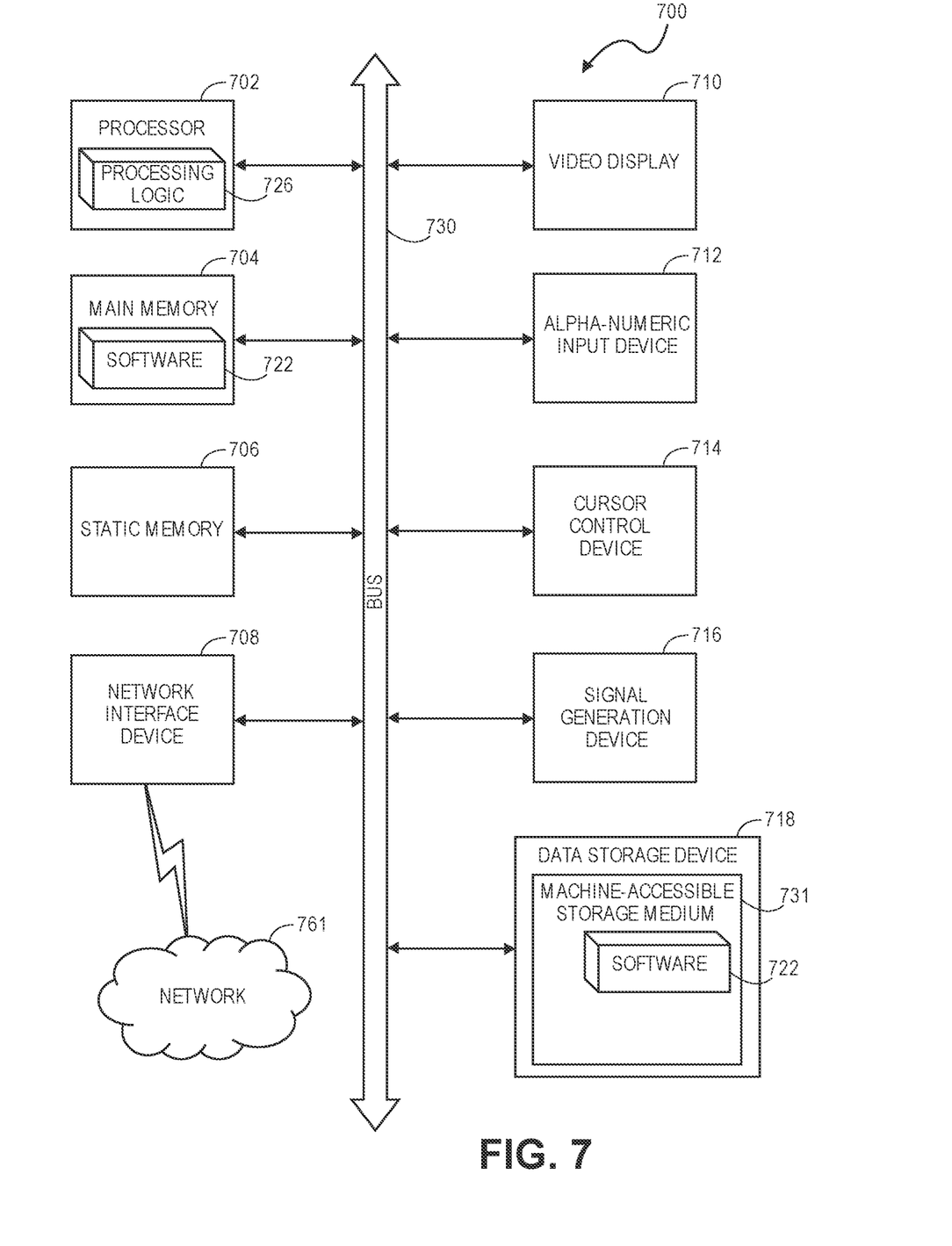
FIG. 7 illustrates a block diagram of an exemplary computer system that may be used in conjunction with a plasma tool, in accordance with an embodiment.

Referring now to FIG. 7, a block diagram of an exemplary computer system 700 of a processing tool is illustrated in accordance with an embodiment. In an embodiment, computer system 700 is coupled to and controls processing in the processing tool. Computer system 700 may be connected (e.g., networked) to other machines in a Local Area Network (LAN), an intranet, an extranet, or the Internet. Computer system 700 may operate in the capacity of a server or a client machine in a client-server network environment, or as a peer machine in a peer-to-peer (or distributed) network environment. Computer system 700 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 700, the term "machine" shall also be taken to include any collection of machines (e.g., computers) that individually or jointly execute a set (or multiple sets) of instructions to perform any one or more of the methodologies described herein.

Computer system 700 may include a computer program product, or software 722, having a non-transitory machine-readable medium having stored thereon instructions, which may be used to program computer system 700 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 700 includes a system processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

System processor 702 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 702 may also be one or more special-purpose processing devices such as an application specific integrated circuit (ASIC), a field programmable gate array (FPGA), a digital signal system processor (DSP), network system processor, or the like. System processor 702 is configured to execute the processing logic 726 for performing the operations described herein.

The computer system 700 may further include a system network interface device 708 for communicating with other devices or machines. The computer system 700 may also include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium 732 (or more specifically a computer-readable storage medium) on which is stored one or more sets of instructions (e.g., software 722) embodying any one or more of the methodologies or functions described herein. The software 722 may also reside, completely or at least partially, within the main memory 704 and/or within the system processor 702 during execution thereof by the computer system 700, the main memory 704 and the system processor 702 also constituting machine-readable storage media. The software 722 may further be transmitted or received over a network 720 via the system network interface device 708. In an embodiment, the network interface device 708 may operate using RF coupling, optical coupling, acoustic coupling, or inductive coupling.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A method of etching a 3D structure, comprising:
   providing the 3D structure in a microwave plasma chamber, wherein the 3D structure comprises:
      a substrate; and
      alternating layers of silicon oxide and silicon nitride over the substrate;
   flowing a first gas into the microwave plasma chamber, wherein the first gas comprises sulfur and fluorine;
   flowing a second gas into the microwave plasma chamber, wherein the second gas comprises an inert gas, and wherein a ratio of the first gas to the second gas is 0.4 or smaller;
   flowing a third gas into the microwave plasma chamber, wherein the third gas comprises dichloro-silane (DCS), and wherein an amount of DCS is less than an amount of the first gas;
   striking a plasma in the microwave plasma chamber; and
   etching the silicon nitride, wherein an etching selectivity of silicon nitride to silicon oxide is 50:1 or greater.

2. The method of claim 1, wherein the first gas comprises $SF_6$.

3. The method of claim 1, wherein the second gas comprises Ar or He.

4. The method of claim 1, wherein a ratio of the first gas to the second gas (first gas/second gas) is 0.3 or less.

5. The method of claim 1, wherein the first gas and the second gas are flown into the microwave plasma chamber through a top gas injection architecture.

6. The method of claim 1, wherein a temperature of the substrate is 500° C. or less.

7. The method of claim 6, wherein the temperature of the substrate is 100° C. or less.

8. The method of claim 1, wherein a pressure in the microwave plasma chamber is 0.6 Torr or lower.

9. The method of claim 8, wherein the pressure in the microwave plasma chamber is 0.3 Torr or lower.

10. The method of claim 1, wherein the microwave plasma chamber comprises:
    a plurality of microwave applicators, wherein each microwave applicator is coupled to a different power source.

11. The method of claim 10, wherein the plurality of applicators are monolithically integrated with a chamber lid.

12. A method for etching silicon nitride selective to silicon oxide, comprising:
    providing a substrate comprising silicon nitride and silicon oxide in a microwave plasma chamber, wherein the microwave plasma chamber comprises:
       a chamber;
       a chamber lid, wherein the chamber lid is a dielectric material;
       a plurality of microwave applicators across a surface of the lid;
       a plurality of power sources, wherein each power source is coupled to one of the plurality of microwave applicators; and
       a gas injection path through the lid;
    flowing a first gas into the chamber, wherein the first gas comprises sulfur and fluorine;
    flowing a second gas into the chamber, wherein the second gas is an inert gas, and wherein a ratio of the first gas to the second gas is 0.4 or smaller;
    flowing a third gas into the microwave plasma chamber, wherein the third gas comprises dichloro-silane (DCS), and wherein an amount of DCS is less than an amount of the first gas;
    striking a plasma in the chamber; and etching the silicon nitride, wherein an etching selectivity of silicon nitride to silicon oxide (silicon nitride:silicon oxide) is 50:1 or greater.

13. The method of claim 12, wherein the first gas comprises $SF_6$.

14. The method of claim 12, wherein the second gas comprises Ar or He.

15. The method of claim 12, wherein a ratio of the first gas to the second gas (first gas/second gas) is 0.3 or less.

16. The method of claim 12, wherein a temperature of the substrate is 100° C. or less.

17. A method of etching a 3D structure, comprising:
  providing the 3D structure in a microwave plasma chamber, wherein the 3D structure comprises:
    a substrate; and
    alternating layers of silicon oxide and silicon nitride over the substrate, and wherein the microwave plasma chamber comprises:
    a chamber;
    a chamber lid, wherein the chamber lid is a dielectric material;
    a plurality of microwave applicators across a surface of the lid;
    a plurality of power sources, wherein each power source is coupled to one of the plurality of microwave applicators; and
    a gas injection path through the lid;
  flowing a first gas into the chamber, wherein the first gas comprises sulfur and fluorine;
  flowing a second gas into the chamber, wherein the second gas is an inert gas, and wherein a ratio of the first gas to the second gas is 0.4 or smaller;
  flowing a third gas into the microwave plasma chamber, wherein the third gas comprises dichloro-silane (DCS), and wherein an amount of DCS is less than an amount of the first gas;
  striking a plasma in the chamber; and
  etching the silicon nitride layers, wherein an etching selectivity of silicon nitride to silicon oxide (silicon nitride:silicon oxide) is 50:1 or greater.

18. The method of claim 17, wherein the first gas comprises $SF_6$, and wherein the second gas comprises Ar or He.

19. The method of claim 17, wherein a temperature of the substrate is 100° C. or less.

* * * * *